United States Patent
Hassan (10) Patent No.: US 11,379,488 B2
(45) Date of Patent: Jul. 5, 2022

(54) ENERGY-EFFICIENT DECAY ALGORITHM FOR NON-VOLATILE MEMORIES

(71) Applicant: SAP SE, Walldorf (DE)

(72) Inventor: Ahmad Hassan, Maidenhead (GB)

(73) Assignee: SAP SE, Walldorf (DE)

( * ) Notice: Subject to any disclaimer, the term of this patent is extended or adjusted under 35 U.S.C. 154(b) by 385 days.

(21) Appl. No.: 16/183,108

(22) Filed: Nov. 7, 2018

(65) Prior Publication Data

US 2020/0142968 A1    May 7, 2020

(51) Int. Cl.
| | |
|---|---|
| G06F 16/2457 | (2019.01) |
| G06F 9/451 | (2018.01) |
| G06F 16/248 | (2019.01) |
| G06F 3/0481 | (2022.01) |

(52) U.S. Cl.
CPC ........ G06F 16/24578 (2019.01); G06F 9/451 (2018.02); G06F 16/248 (2019.01); G06F 3/0481 (2013.01)

(58) Field of Classification Search
CPC .. G06F 16/24578; G06F 9/451; G06F 16/248; G06F 3/0481
See application file for complete search history.

(56) References Cited

U.S. PATENT DOCUMENTS

| | | | |
|---|---|---|---|
| 8,094,686 B2 * | 1/2012 | Bedrosian | H04L 43/50 370/503 |
| 2007/0260596 A1 * | 11/2007 | Koran | G06F 16/84 707/999.005 |
| 2018/0067945 A1 * | 3/2018 | Jain | G06Q 30/0241 |
| 2019/0034102 A1 * | 1/2019 | Miller | G06F 3/067 |
| 2019/0266289 A1 * | 8/2019 | Bartholomew | G06F 16/9535 |

OTHER PUBLICATIONS

Andrew Cholakian, 'A Gentle Intro to Function Scoring', Apr. 26, 2014, https://www.elastic.co/blog/found-function-scoring (Year: 2014).*

* cited by examiner

*Primary Examiner* — Mark D Featherstone
*Assistant Examiner* — Faezeh Forouharnejad
(74) *Attorney, Agent, or Firm* — Schwegman Lundberg & Woessner, P.A.

(57) ABSTRACT

In an example, information about interactions by users, via the graphical user interface, with a plurality of items rendered in the graphical user interface, is obtained, the information including a timestamp of a time and date at which the corresponding interaction occurred. A series of operations is performed upon detecting a condition that triggers a ranking of items rendered in the graphical user interface, for each item for which the condition applies. A ranking score is calculated for the item and a decay is applied to the ranking score by applying a Gaussian distribution, using the timestamp of the item as an origin to the Gaussian distribution, producing a decayed ranking score. The items for which the condition applies are then ranked based on their respective decayed ranking scores and a subset is rendered in the graphical user interface in an order matching the ranking.

20 Claims, 6 Drawing Sheets

ENERGY-EFFICIENT DECAY ALGORITHM FOR NON-VOLATILE MEMORIES

TECHNICAL FIELD

This document generally relates to the field of non-volatile computer memories. More specifically, this document relates to a scalable and energy-efficient item ranking decay algorithm for data stored on non-volatile memories.

BACKGROUND

The field of memory storage for computing devices has evolved significantly in the last decade. Traditionally, long-term storage was performed via disk-based storage devices while short-term storage was performed using main memory such as Random Access Memory (RAM). Two major types of RAM are static RAM (SRAM) and dynamic RAM (DRAM). Disk-based storage devices were cheaper in cost for the same amount of memory as RAM, and could continue to store data without external energy sources such as electricity. Two major types of disk-based storage devices are Flash Memory and Hard Disk Drives. In recent years, however, companies have experimented with blurring the lines between RAM and disk-based storage, and between volatile and non-volatile memory.

One way that these lines are being blurred is through the use of what is known as Emerging Non-Volatile Memory (Emerging NVM). Emerging NVM combines the speed of SRAM, the density of DRAM, and the non-volatility of Flash memory.

While Emerging NVMs are generally high-density with low-leakage, one drawback is that their dynamic energy usage is high, especially duffing write operations. An additional drawback of Emerging NVMs is that each write that is performed reduces the lifetime of the cell to which the data is being written. The result is that it is beneficial from energy and cost standpoints to reduce the number of writes performed in an Emerging NVM.

BRIEF DESCRIPTION OF DRAWINGS

The present disclosure is illustrated by way of example and not limitation in the figures of the accompanying drawings, in which like references indicate similar elements.

DETAILED DESCRIPTION

The description that follows discusses illustrative systems, methods, techniques, instruction sequences, and computing machine program products. In the following description, for purposes of explanation, numerous specific details are set forth in order to provide an understanding of various example embodiments of the present subject matter. It will be evident, however, to those skilled in the art, that various example embodiments of the present subject matter may be practiced without these specific details.

In an example embodiment, a scalable and energy-efficient item ranking decay algorithm is introduced that reduces the number of write operations being performed on an Emerging NVM cell. This not only reduces the performance degradation due to slow writes but also increases the energy savings by avoiding updating decaying scores frequently. In an example embodiment, a novel design is introduced that captures item events from an online website and fits an item update timestamp on a Gaussian statistical distribution curve. By mapping the update timestamp of each item to a bell-shaped distribution, the recency score of an item can be obtained with respect to the time when it was last updated.

In conventional approaches, an online website may decay the importance of a particular item based on the last time the item was updated and/or interacted with. Specifically, all online events involving an item, such as viewing, selecting, updating, etc., are recorded and time-stamped. Each of these events may impact how highly the item is ranked for future online searches (for example, items that have been selected or viewed in the last 24 hours may be ranked higher than items that have not), and the score assigned to the item for ranking purposes may decay over time. This item decay process runs regularly and decrements the score of each item by some defined factor. This method, however, is not scalable and causes unnecessary write operations to the underlying memory, which is energy inefficient in the case of Emerging NVM storage as it requires storing large amounts of time-stamped event information in the Emerging NVM storage.

Specifically, it is common for such decay processes to utilize a sliding window approach. A time window of some fixed length is established, for example 5 minutes. The ranking scores for each item are then recalculated for each time window; thus every 5 minutes the ranking score for every item is recalculated and stored. The result is that the Emerging NVM storage uses a significant amount of energy and lifespan in saving these scores every 5 minutes.

In an example embodiment, rather than recalculating the scores every 5 minutes, the scores are only recalculated when needed, e.g., when a user performs a search that produces search results that need to be ranked. Furthermore, since the sliding window approach is not used, in an example embodiment only the timestamps from the actual interactions that occurred with an item are accessed, and then a Gaussian distribution is used to map the item on a curve on the basis of the interaction timestamps. The result is that, in fact, no write operations are required for the scores, as the score itself is never saved—it is calculated at runtime using only read operations to read interaction timestamps.

The Gaussian function is bell-shaped. It decays slowly, then rapidly, then slows down again. This is exactly the performance that may be advantageous for website item updates. Items may be viewed or otherwise interacted with frequently, for example during the first 24 hours they are available on a website, and thus decay during that initial time period should be slow. After this initial time period, there is a sharp decrease in decay until the decay then slows down again at the other edge of the curve. However, the shape of the curve can be controlled through shape and scale parameters of the distribution. Depending on traffic, the shape of the curve can be tweaked by selected scale and offset parameters of the Gaussian distribution.

In an example embodiment, the ranking score may be computed as follows:

$$\text{ranking score} = \exp\left(-\frac{(|metric_{value} - origin| - offset)^2}{2 \cdot scale^2 / 2 * \ln(decay)^2}\right)$$

The origin is the start of the curve. This is the timestamp. The scale describes how the scores will decay while moving away from the origin; the offset is the beginning of the range of values where the curve is not very steep. The decay is a score that the item will receive for a given scale.

In an example embodiment, a Representational State Transfer (REST)-ful distributed search and analytics engine such as Elasticsearch may be used to store data on the Emerging NVM. The goal is to reduce the number of reads and writes going to the NVM. As such, the following three items may be created in the Elasticsearch data store:

```
[
 {
  "_index": "decay",
  "_type": "product",
  "_id": "2",
  "_score": 1,
  "_source": {
   "name": "product 2",
   "sale": 6000,
   "conversion": 1000,
   "created_at": "2018-04-22T12:00:00"
  }
 },
 {
  "_index": "decay",
  "_type": "product",
  "_id": "1",
  "_score": 1,
  "_source": {
   "name": "product 1",
   "sale": 500,
   "conversion": 100,
   "created_at": "2018-04-22T08:00:00"
  }
 },
 {
  "_index": "decay",
  "_type": "product",
  "_id": "3",
  "_score": 1,
  "_source": {
   "name": "product 3",
   "sale": 50,
   "conversion": 10,
   "created_at": "2018-04-22T23:00:00"
  }
 }
]
```

As Elasticstore is a JavaScript Object Notation (JSON) score, three JSON structures above can be stored with IDs 1, 2, and 3. All three documents have different created_at timestamps where product 3 has been created as the last.

In the above example, sale and conversion are two metrics that show the scores computed by the scoring engine for a particular product. In an example embodiment, instead of scheduling frequent write calls to the Emerging NVM to reduce/decay the scores, a Gaussian curve is used to map the created_at timestamp on the Gaussian curve to obtain a normalized score on the same scale as the sale and conversion scores. The scores may then be combined to form a total aggregated ranking score that may be based on the ranking score at query/search time.

It should be noted that while the above example describes aspects of the functionality with respect to combining the decayed timestamp with a sale and conversion score, depending on implementation, the decayed timestamp may be combined with any type of score to produce the ranking score—it is not necessary that the scores be sale or conversion scores or even be related to products.

For example, an overall aggregated ranking score of an item may be based on different metrics in a mixcard, with the position of the item on the Gaussian curve (called decay factor) as only one factor in calculating the aggregated ranking score.

If the origin of the Gaussian distribution is chosen to be the current time, then the Gaussian distribution will ensure that the most trending items within the last 24 hours will receive the highest aggregated ranking scores. The Gaussian distribution scale and offset can be configured to map this 24 hours to 12 hours or any other period.

In an example embodiment, the elasticsearch request for aggregating results of a sales metric and Gaussian delay may be:

```
"query": {
 "function_score": {
  "functions": [
   {
    "field_value_factor": {
     "field": "sale",
     "factor": 1,
     "modifier": "none",
     "missing": 0
    }
   },
   {
    "field_value_factor": {
     "field": "views",
     "factor": 1,
     "modifier": "none",
     "missing": 0
    }
   },
   {
    "gauss": {
     "created_at": {
      "origin": "2018-04-22T23:50:00",
      "scale": "24h",
      "offset": "1h",
      "decay": 0.3
     }
    },
    "weight": 1000000
   }
  ],
  "score_mode": "sum",
  "boost_mode": "multiply"
 }
}
```

Using the above query, the items may be in the following order:

```
{
 "_index": "decay",
 "_type": "product",
 "_id": "3",
```

```
        "_score": 1000050,
        "_source": {
            "name": "product 3",
            "sale": 50,
            "conversion": 10,
            "created_at" "2014-04-22T23:00:00"
        }
    },
    {
        "_index": "decay",
        "_type": "product",
        "_id": "2",
        "_score": 380843.34,
        "_source": {
            "name": "product 2",
            "sale": 6000,
            "conversion": 1000,
            "created_at": "2014-04-22T12:00:00"
        }
    },
    {
        "_index": "decay",
        "_type": "product",
        "_id": "1",
        "_score": 159375.38,
        "_source": {
            "name": "product 1",
            "sale": 500,
            "conversion": 100,
            "created_at": "2014-04-22T08:00:00"
        }
    }
]
```

As can be seen, product 3 is at the top of the list because it is recent and has the least decay, whereas product 1 is at the bottom of the list because it is older and has decayed significantly.

Thus, as a general rule, first an aggregated score calculation may be determined based on factors other than time For example, in the case of products, the aggregated score calculation may be AGGREGATED_SCORE=X*factor_1+ Y*factor_2, where X is the number of product views and Y is the number of product sales, and factor_1 and factor_2 are predetermined constants (such as 0.9 and 0.1, respectively). In some example embodiments X and Y may be normalized prior to this calculation.

Then a decay score is calculated for each item using a Gaussian curve on the basis of timestamp as being the origin or start of the Gaussian curve, producing a normalized decay score. The normalized decay score is then combined with the aggregated score to produce an aggregated ranking score.

To provide further context, various types of NVM are described in further detail. Example types of NVM include phase-change memory (PCM), spin-transfer torque RAM (STT-RAM) and RRAM. In some examples, NVM memory chips are byte-addressable, non-volatile, require near-Zero leakage power, and have density and latency closer to current DRAM technology. Unlike DRAM, however, NVM includes asymmetric read, write, and erase latencies.

In general, PCM exploits the properties of chalcogenide glass when heated and cooled at different speeds. The latency and dynamic energy of PCM, however, is worse compared to other technologies. In comparison to DRAM, for example, PCM is approximately 2× slower for array read and approximately 43× slower for array write, while leakage power is approximately 1% of DRAM. In general, STT RAM is a magnetic RAM device that stores data using the orientation of a magnetic field. In some examples, STT RAM has lower latency than PCM. The dynamic energy and density of STT-RAM is worse than DRAM. STT-RAM, however, has better endurance (e.g., 1015 cycles) as compared to other NVM technologies. In general, RRAM uses measurable change in resistance resulting from the movement of ions to represent 0 or 1. RRAM devices based on memristors are a promising NVM technology for the realization of faster, high density, non-volatile and low-power main memory.

Figure 1:
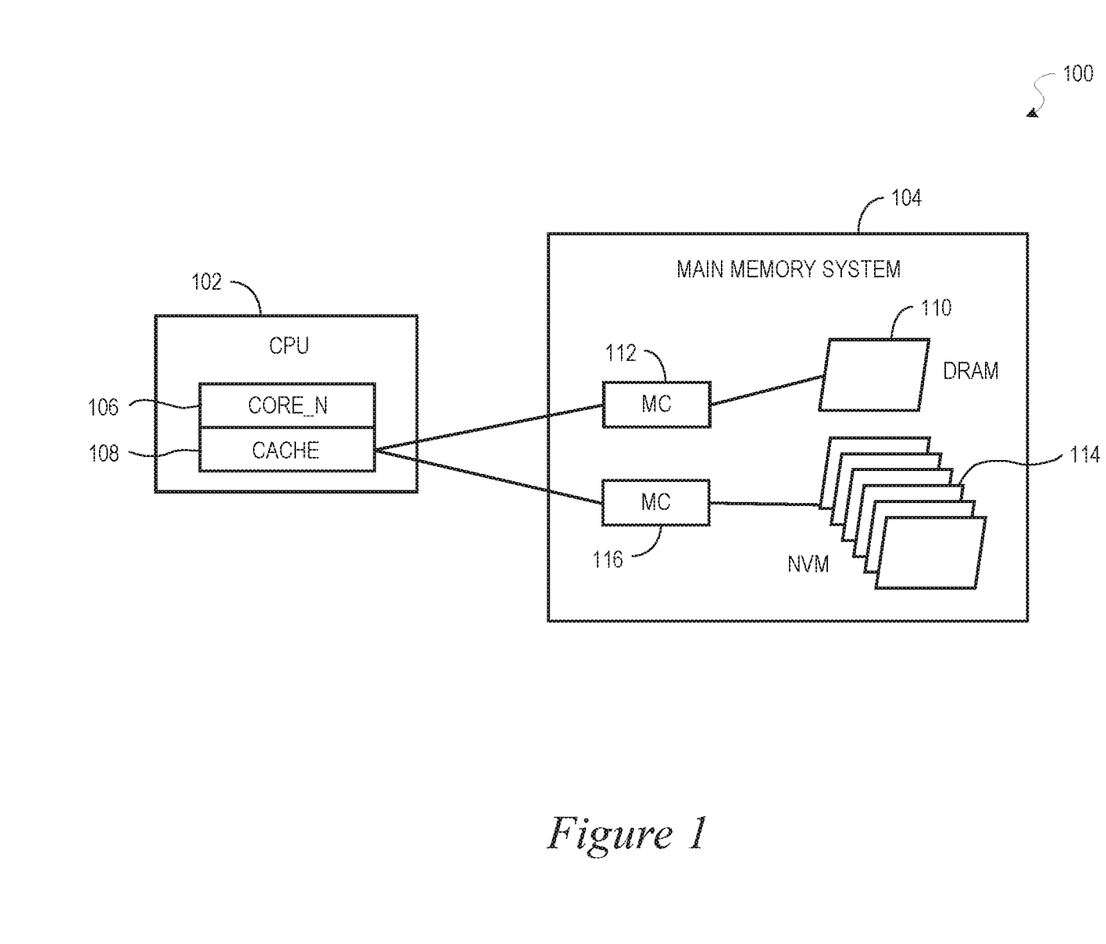
FIG. 1 depicts an example memory architecture that can be implemented within an enterprise server.

FIG. 1 depicts an example memory architecture 100 that can be implemented within an enterprise server. In the example of FIG. 1, the example memory architecture 100 includes a central processing unit (CPU) 102 and a main memory system 104. The CPU 102 includes a core 106 having a respective cache 108. Although a single core 106 and respective cache 108 is depicted, it is appreciated that the CPU 102 can include multiple cores, each with a respective cache. Further, although a single CPU 102 is depicted, it is appreciated that enterprise servers can include multiple CPUs. The main memory system 104 optionally includes DRAM 110 with a respective memory controller (MC) 112, and NVM 114 with a respective MC 116. In some examples, the cache 108 accesses (e.g., reads, writes, deletes) the DRAM 110 through the MC 112, and accesses (e.g., reads, writes, deletes) the NVM 114 through the MC 112.

In some examples, the example memory architecture 100 can be implemented in an in-memory database system. An in-memory database system is a database management system that uses main memory for data storage. In some examples, main memory includes random access memory (RAM) that communicates with one or more processors, e.g., central processing units (CPUs), over a memory bus. An in-memory database system can be contrasted with database management systems that employ a disk storage mechanism. In some examples, in-memory database systems are faster than disk storage databases, because internal optimization algorithms can be simpler and execute fewer CPU instructions. In some examples, accessing data in an in-memory database system eliminates seek time when querying the data, which provides faster and more predictable performance than disk-storage databases. In some examples, an in-memory database can be provided as a column-oriented in-memory database, in which data tables are stored as sections of columns of data (rather than as rows of data). An example in-memory database system includes HAMA, provided by SAP SE of Walldorf, Germany.

The presence of both NVM 114 and DRAM 110 in the example memory architecture 100 permits the possibility of utilizing both together as a hybrid in-memory database system. For purposes of the present disclosure, however, the focus will be on write operations that are traditionally performed in NVM 114 and whose elimination would result in significant energy savings and lengthen the life of the NVM 114.

Figure 2:
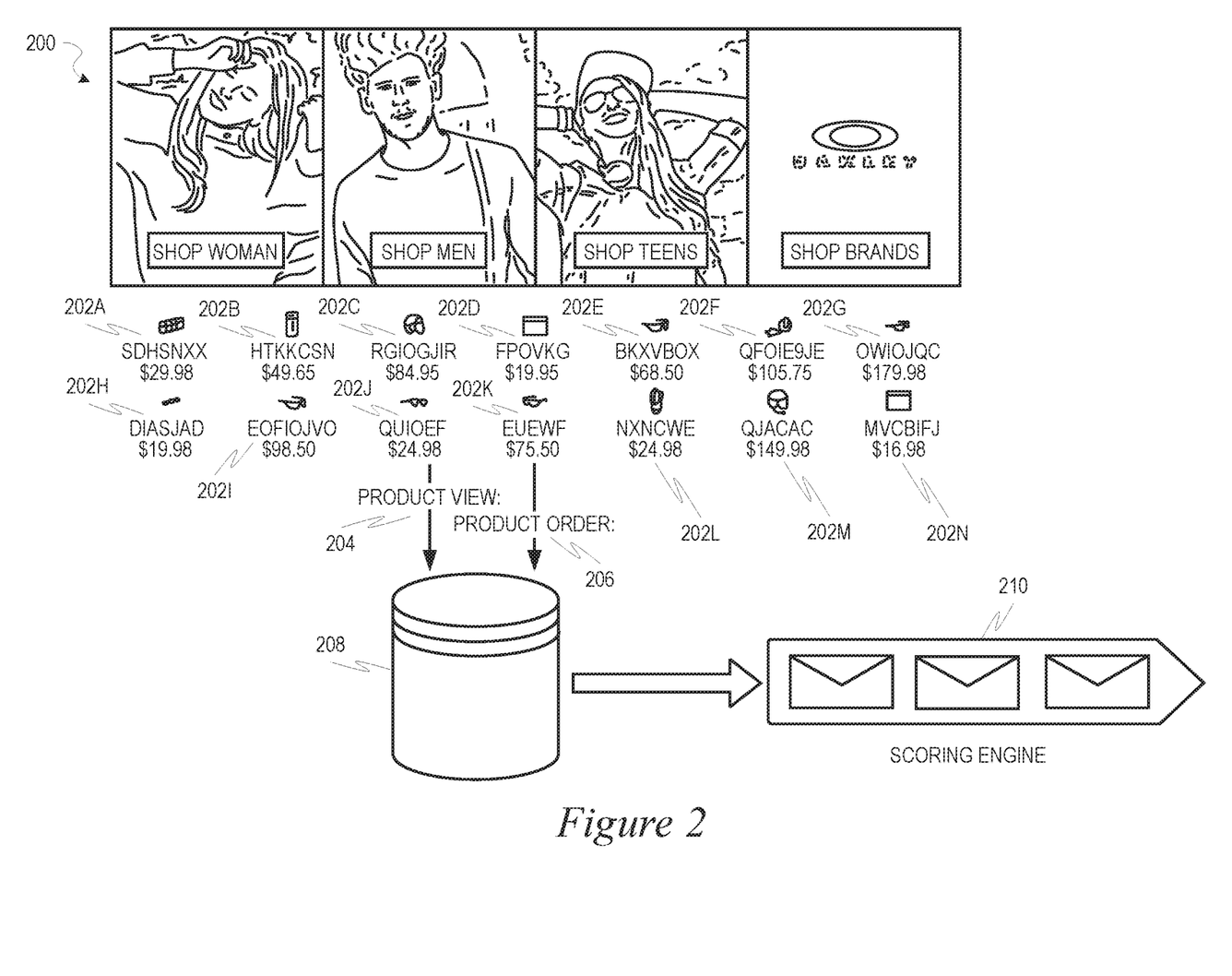
FIG. 2 is an example of how the techniques described in the present disclosure can be applied to ranking of items (e.g., products sold) on a web store.

FIG. 2 is an example of how the techniques described in the present disclosure can be applied to ranking of products sold on a web store. A graphical user interface 200 may display a plurality of different products 202A-202N that a user can interact with via the graphical user interface 200. In this example, these interactions may take the form of product views 204 or product orders 206, although other types of interactions are possible as well (e.g., social-network-related interactions such as liking, sharing, and commenting, and other interactions such as favoriting/saving for later). These interactions may be stored in a first data store 208 as they occur, along with timestamps for each of these interactions. A ranking scoring engine 210 may later receive a request from the graphical user interface 200 to rank a series of products (for example, in response to a search or browse operation requested by a user via the graphical user interface 200) and then may retrieve the timestamps for each of the products under consideration (e.g., those that match the search query or browser request). The scoring engine 210 may then perform the Gaussian decay process described above to the timestamps of each of these products under consideration, retrieved from the first data store 208, and then may combine the results of this Gaussian decay process to an aggregated score computed based on other factors. The result is an aggregated ranking score for each of the products under consideration, which can be used to sort the products under consideration for display in the graphical user interface 200 as a results page.

Figure 3:
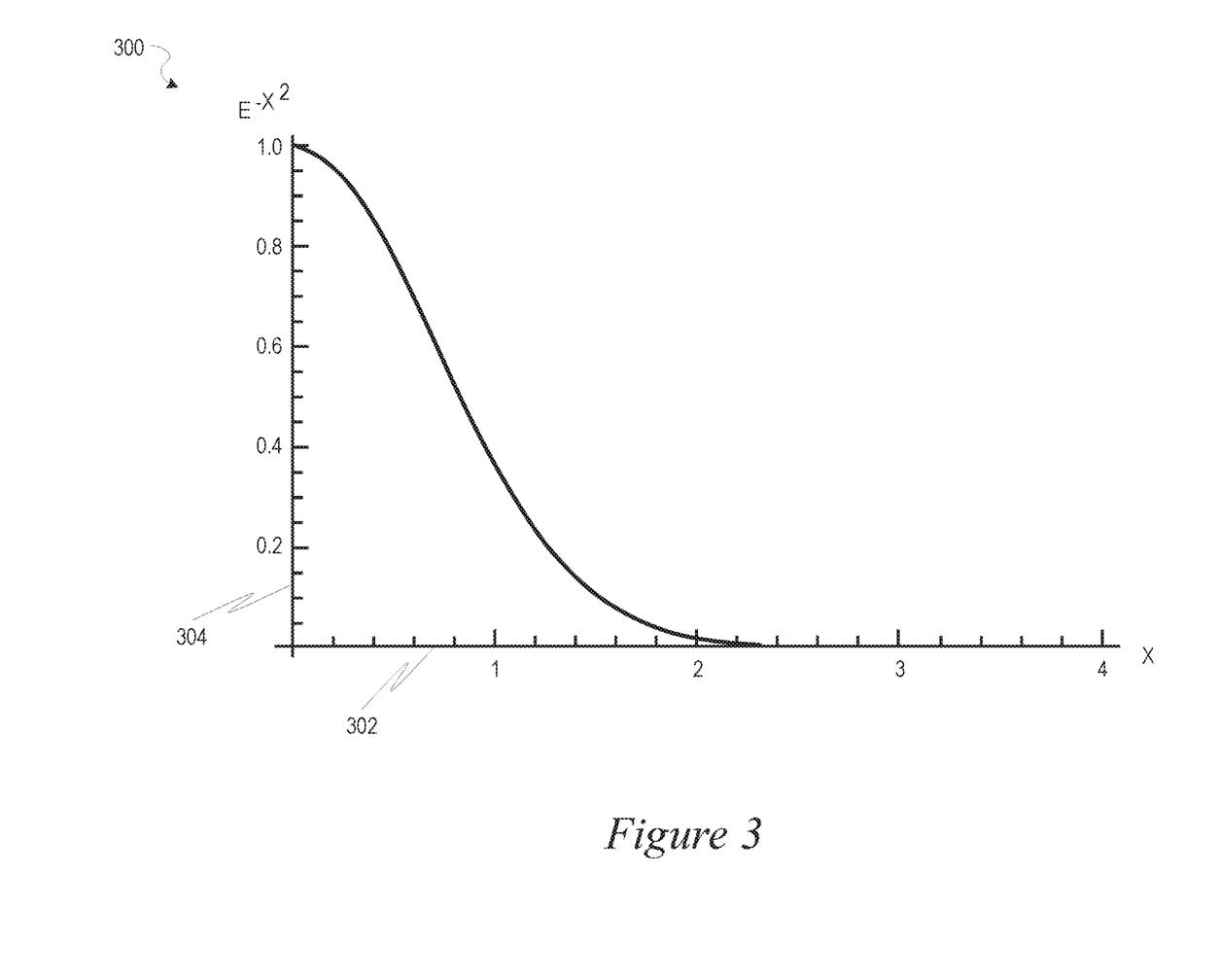
FIG. 3 is a graph diagram illustrating a Gaussian distribution curve in accordance with an example embodiment.

FIG. 3 is a graph diagram illustrating a Gaussian distribution curve 300 in accordance with an example embodiment. Here, the Gaussian distribution curve 300 has time 302 on one axis and probability as a function of time 304 on the other.

Figure 4:
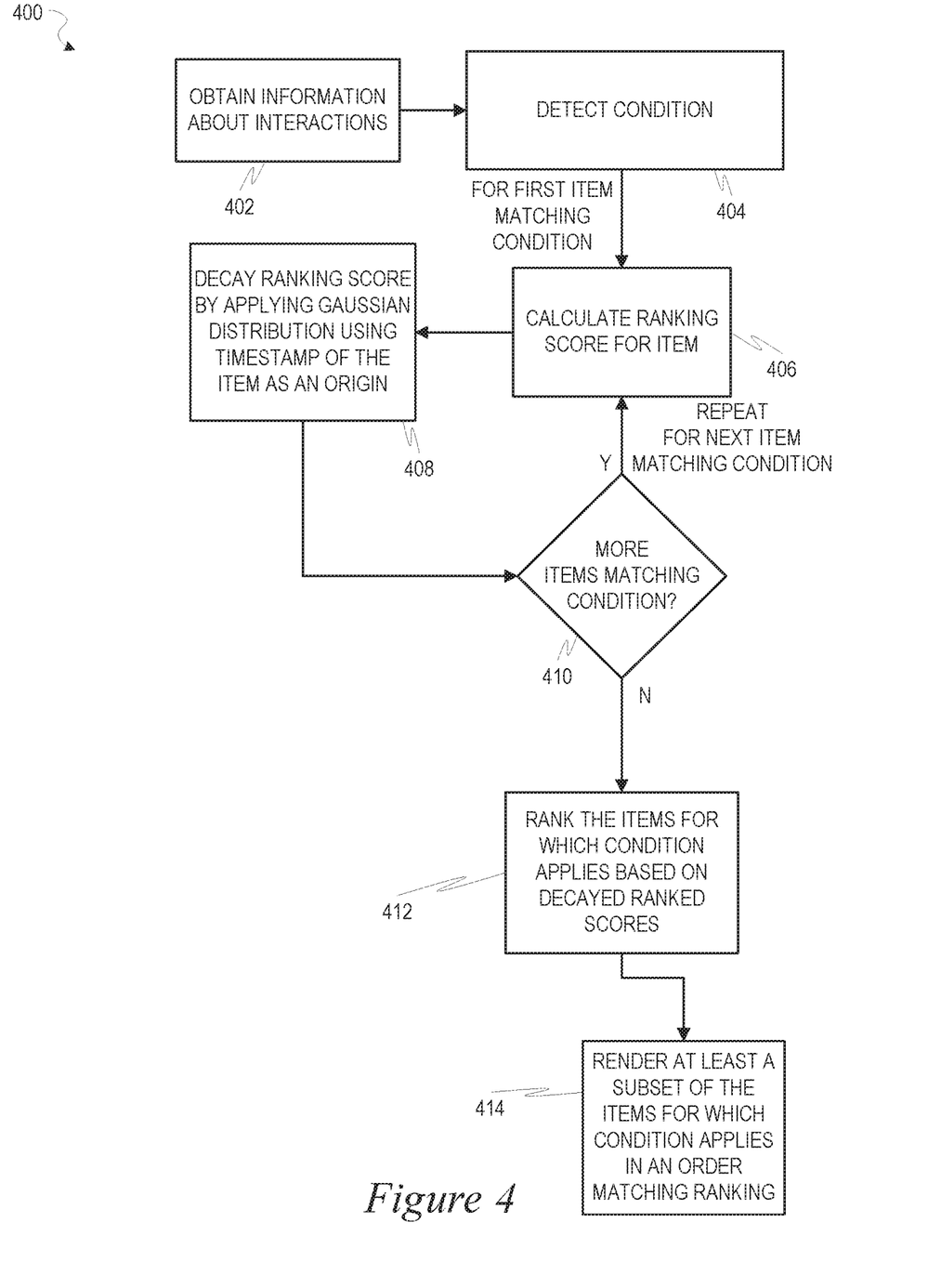
FIG. 4 is a flow diagram illustrating a method, in accordance with an example embodiment, for energy-efficient management of a non-volatile memory.

FIG. 4 is a flow diagram illustrating a method, in accordance with an example embodiment, for energy-efficient management of a non-volatile memory.

At operation 402, information is obtained about interactions by users, via a graphical user interface, with a plurality of items rendered in the graphical user interface. This information may include a timestamp of a time and date at which the corresponding interaction occurred. In an example embodiment, each interaction is stored as its own record that includes the timestamp, an identification of the type of interaction, and an identification of the item on which the interaction was performed. This information about interactions may be stored in a data store.

At operation 404 a condition that triggers a ranking of items rendered is detected. This condition may be an identification of matching items in response to a search query or browser operation requested by a user in a graphical user interface. For example, the condition may be met by any item matching the criteria specified in the search result. A loop is then begun for each of the items matching the condition. At operation 406, a ranking score is calculated for the item. The ranking score may itself be an aggregation. For example, the ranking score may be calculated by normalizing first information about the item, normalizing second information about the item, and calculating the ranking score by multiplying the normalized first information about the item to a first information factor, producing a first product and adding the first product to a second product calculated by multiplying the normalized second information about the item to a second information factor.

At operation 408, a decay is applied to the ranking score by applying a Gaussian distribution, using the timestamp of the item as an origin to the Gaussian distribution, producing a decayed ranking score. At operation 410, it is determined if there are any more items matching the condition. If so, then the method 400 loops back to operation 406 for the next matching item.

If not, then at operation 412 the items for which the condition applies are ranked based on their respective decayed ranking scores. At operation 414, at least a subset of items for which the condition occurs are rendered in the graphical user interface in an order matching the ranking.

EXAMPLES

Example 1. A system comprising:
at least one hardware processor;
a non-volatile memory (NVM); and
a computer-readable medium storing instructions that, when executed by the at least one hardware processor, cause the at least one hardware processor to perform operations comprising:
obtaining information obtained via a graphical user interface, the information relating to information about interactions by users with a plurality of items rendered in the graphical user interface, the information including a timestamp of a time and date at which the corresponding interaction occurred;
upon detecting a condition that triggers a ranking of items rendered in the graphical user interface, for each item for which the condition applies:
calculating a ranking score for the item;
applying a decay to the ranking score by applying a Gaussian distribution, using the timestamp of the item as an origin to the Gaussian distribution, to produce a decayed ranking score;
ranking the items for which the condition applies based on their respective decayed ranking scores; and
rendering at least a subset of items for which the condition occurs in the graphical user interface in an order matching the ranking.

Example 2. The system of Example 1, where the condition that triggers a ranking of items is a search query matching the items.

Example 3. The system of Examples 1 or 2, wherein the condition that triggers a ranking of items is a browse request to a category that matches the items.

Example 4. The system of any of Examples 1-3, wherein the calculating a ranking score comprises:
normalizing first information about the item;
normalizing second information about the item; and
calculating the ranking score by multiplying the normalized first information about the item to a first information factor, producing a first product and adding the first product to a second product calculated by multiplying the normalized second information about the item to a second information factor.

Example 5. The system of Example 4, wherein the first information factor and the second information factor add up together to 1.

Example 6. The system of any of Examples 1-5, wherein the NVM is phase-change memory.

Example 7. The system of any of Examples 1-6, wherein the NVM is spin-transfer torque random access memory.

Example 8. A method comprising:
obtaining information obtained via a graphical user interface, the information relating to information about interactions by users with a plurality of items rendered in the graphical user interface, the information including a timestamp of a time and date at which the corresponding interaction occurred;
upon detecting a condition that triggers a ranking of items rendered in the graphical user interface, for each item for which the condition applies:
calculating a ranking score for the item;
applying a decay to the ranking score by applying a Gaussian distribution, using the timestamp of the item as an origin to the Gaussian distribution, to produce a decayed ranking score, stored in a non-volatile memory;
ranking the items for which the condition applies based on their respective decayed ranking scores; and
rendering at least a subset of items for which the condition occurs in the graphical user interface in an order matching the ranking.

Example 9. The method of Example 8, where the condition that triggers a ranking of items is a search query matching the items.

Example 10. The method of Examples 8 or 9, wherein the condition that triggers a ranking of items is a browse request to a category that matches the items.

Example 11. The method of any of Examples 8-10, wherein the calculating a ranking score comprises:
- normalizing first information about the item;
- normalizing second information about the item; and
- calculating the ranking score by multiplying the normalized first information about the item to a first information factor, producing a first product and adding the first product to a second product calculated by multiplying the normalized second information about the item to a second information factor.

Example 12. The method of Example 11, wherein the first information factor and the second information factor add up together to 1.

Example 13. The method of any of Examples 8-12, wherein the NVM is phase-change memory.

Example 14. The method of any of Examples 8-13, wherein the NVM is spin-transfer torque random access memory.

Example 15. A non-transitory machine-readable medium storing instructions which, when executed by one or more processors, cause the one or more processors to perform operations comprising:
- obtaining information obtained via a graphical user interface, the information relating to information about interactions by users with a plurality of items rendered in the graphical user interface, the information including a timestamp of a time and date at which the corresponding interaction occurred;
- upon detecting a condition that triggers a ranking of items rendered in the graphical user interface, for each item for which the condition applies:
  - calculating a ranking score for the item;
  - applying a decay to the ranking score by applying a Gaussian distribution, using the timestamp of the item as an origin to the Gaussian distribution, to produce a decayed ranking score, stored in a non-volatile memory;
- ranking the items for which the condition applies based on their respective decayed ranking scores; and
- rendering at least a subset of items for which the condition occurs in the graphical user interface in an order matching the ranking.

Example 16. The non-transitory machine-readable medium storing instructions of Example 15, where the condition that triggers a ranking of items is a search query matching the items.

Example 17. The non-transitory machine-readable medium storing instructions of Examples 15 or 16, wherein the condition that triggers a ranking of items is a browse request to a category that matches the items.

Example 18. The non-transitory machine-readable medium storing instructions of any of Examples 15-17, wherein the calculating a ranking score comprises:
- normalizing first information about the item;
- normalizing second information about the item; and
- calculating the ranking score by multiplying the normalized first information about the item to a first information factor, producing a first product and adding the first product to a second product calculated by multiplying the normalized second information about the item to a second information factor.

Example 19. The non-transitory machine-readable medium storing instructions of Example 18, wherein the first information factor and the second information factor add up together to 1.

Example 20. The non-transitory machine-readable medium storing instructions of any of Examples 15-19, wherein the NVM is phase-change memory.

Figure 5:
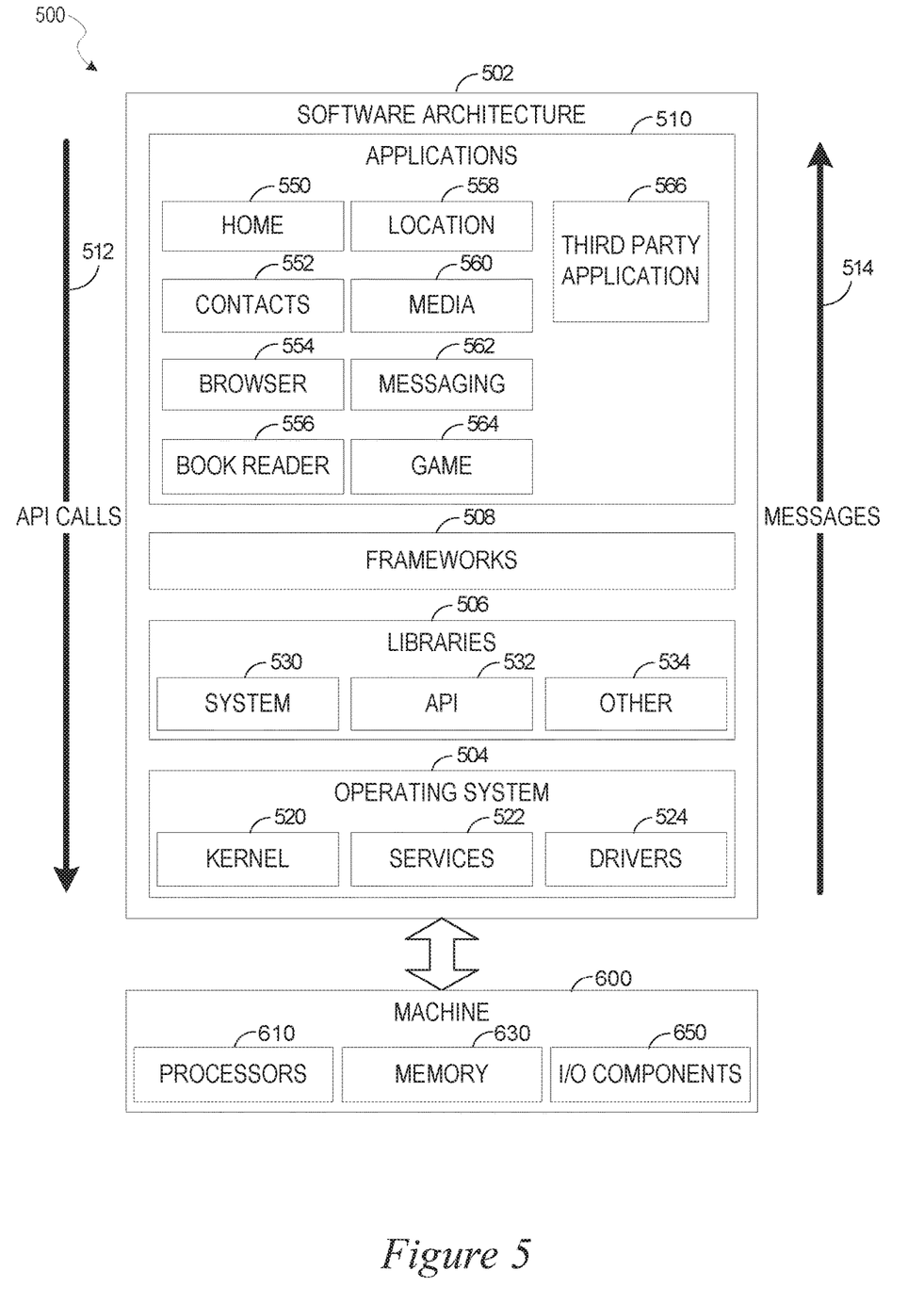
FIG. 5 is a block diagram illustrating an example architecture of software, which can be installed on any one or more of the devices described above.

FIG. 5 is a block diagram 500 illustrating an architecture of software 502, which can be installed on any one or more of the devices described above. FIG. 5 is merely a non-limiting example of a software architecture, and it will be appreciated that many other architectures can be implemented to facilitate the functionality described herein. In various embodiments, the software 502 is implemented by hardware such as a machine 600 of FIG. 6 that includes processors 610, memory 630, and input/output (I/O) components 650. In this example architecture, the software 502 can be conceptualized as a stack of layers where each layer may provide a particular functionality. For example, the software 502 includes layers such as an operating system 504, libraries 506, frameworks 508, and applications 510. Operationally, the applications 510 invoke API calls 512 through the software stack and receive messages 514 in response to the API calls 512, consistent with some embodiments.

In various implementations, the operating system 504 manages hardware resources and provides common services. The operating system 504 includes, for example, a kernel 520, services 522, and drivers 524. The kernel 520 acts as an abstraction layer between the hardware and the other software layers, consistent with some embodiments. For example, the kernel 520 provides memory management, processor management (e.g., scheduling), component management, networking, and security settings, among other functionality. The services 522 can provide other common services for the other software layers. The drivers 524 are responsible for controlling or interfacing with the underlying hardware, according to some embodiments. For instance, the drivers 524 can include display drivers, camera drivers, BLUETOOTH® or BLUETOOTH® Low-Energy drivers, flash memory drivers, serial communication drivers (e.g., Universal Serial Bus (USB) drivers), Wi-Fi® drivers, audio drivers, power management drivers, and so forth.

In some embodiments, the libraries 506 provide a low-level common infrastructure utilized by the applications 510. The libraries 506 can include system libraries 530 (e.g., C standard library) that can provide functions such as memory allocation functions, string manipulation functions, mathematic functions, and the like. In addition, the libraries 506 can include API libraries 532 such as media libraries (e.g., libraries to support presentation and manipulation of various media formats such as Moving Picture Experts Group-4 (MPEG4), Advanced Video Coding (H.264 or AVC), Moving Picture Experts Group Layer-3 (MP3), Advanced Audio Coding (AAC), Adaptive Multi-Rate (AMR) audio codec, Joint Photographic Experts Group (JPEG or JPG), or Portable Network Graphics (PNG)), graphics libraries (e.g., an OpenGL framework used to render in 2D and 3D in a graphic context on a display), database libraries (e.g., SQLite to provide various relational database functions), web libraries (e.g., WebKit to provide web browsing functionality), and the like. The libraries 506 can also include a wide variety of other libraries 534 to provide many other APIs to the applications 510.

The frameworks 508 provide a high-level common infrastructure that can be utilized by the applications 510, according to some embodiments. For example, the frameworks 508 provide various graphical user interface (GUI) functions, high-level resource management, high-level location services, and so forth. The frameworks 508 can provide a broad spectrum of other APIs that can be utilized by the applications 510, some of which may be specific to a particular operating system 504 or platform.

In an example embodiment, the applications 510 include a home application 550, a contacts application 552, a browser application 554, a book reader application 556, a location application 558, a media application 560, a messaging application 562, a game application 564, and a broad assortment of other applications, such as a third-party application 566. According to some embodiments, the applications 510 are programs that execute functions defined in the programs. Various programming languages can be employed to create one or more of the applications 510, structured in a variety of manners, such as object-oriented programming languages (e.g., Objective-C, Java, or C++) or procedural programming languages (e.g., C or assembly language). In a specific example, the third-party application 566 (e.g., an application developed using the ANDROID™ or IOS™ software development kit (SDK) by an entity other than the vendor of the particular platform) may be mobile software running on a mobile operating system such as IOS™, ANDROID™, WINDOWS® Phone, or another mobile operating system. In this example, the third-party application 566 can invoke the API calls 512 provided by the operating system 504 to facilitate functionality described herein.

Figure 6:
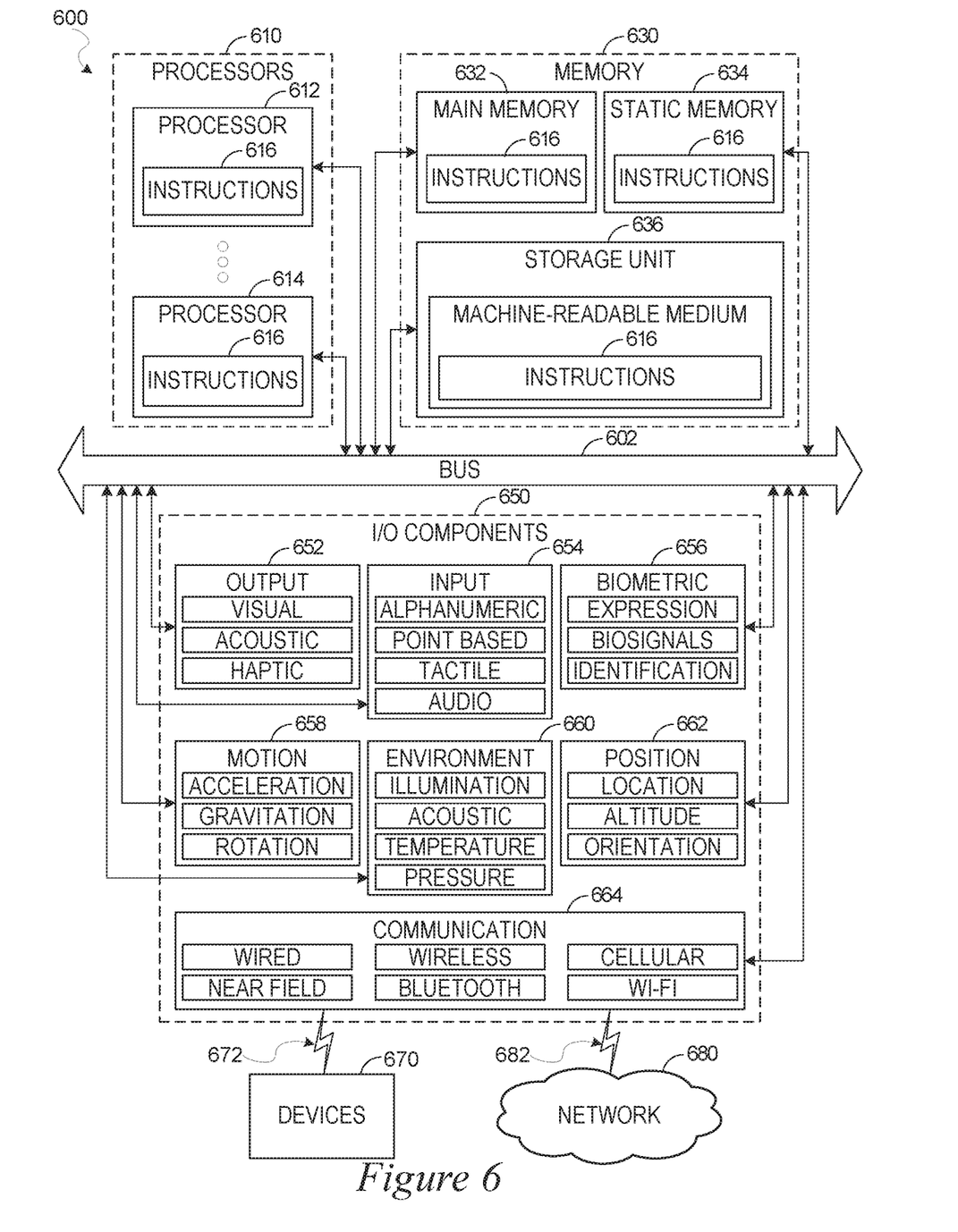
FIG. 6 illustrates a diagrammatic representation of a machine in the form of a computer system within which a set of instructions may be executed for causing the machine to perform any one or more of the methodologies discussed herein, according to an example embodiment.

FIG. 6 illustrates a diagrammatic representation of a machine 600 in the form of a computer system within which a set of instructions may be executed for causing the machine 600 to perform any one or more of the methodologies discussed herein, according to an example embodiment. Specifically, FIG. 6 shows a diagrammatic representation of the machine 600 in the example form of a computer system, within which instructions 616 (e.g., software, a program, an application, an applet, an app, or other executable code) for causing the machine 600 to perform any one or more of the methodologies discussed herein may be executed. For example, the instructions 616 may cause the machine 600 to execute the method 400 of FIG. 4. Additionally, or alternatively, the instructions 616 may implement FIGS. 1-4 and so forth. The instructions 616 transform the general, non-programmed machine 600 into a particular machine 600 programmed to carry out the described and illustrated functions in the manner described. In alternative embodiments, the machine 600 operates as a standalone device or may be coupled (e.g., networked) to other machines. In a networked deployment, the machine 600 may operate in the capacity of a server machine or a client machine in a server-client network environment, or as a peer machine in a peer-to-peer (or distributed) network environment. The machine 600 may comprise, but not be limited to, a server computer, a client computer, a personal computer (PC), a tablet computer, a laptop computer, a netbook, a set-top box (STB), a personal digital assistant (PDA), an entertainment media system, a cellular telephone, a smart phone, a mobile device, a wearable device (e.g., a smart watch), a smart home device (e.g., a smart appliance), other smart devices, a web appliance, a network router, a network switch, a network bridge, or any machine capable of executing the instructions 616, sequentially or otherwise, that specify actions to be taken by the machine 600. Further, while only a single machine 600 is illustrated, the term "machine" shall also be taken to include a collection of machines 600 that individually or jointly execute the instructions 616 to perform any one or more of the methodologies discussed herein.

The machine 600 may include processors 610, memory 630, and I/O components 650, which may be configured to communicate with each other such as via a bus 602. In an example embodiment, the processors 610 (e.g., a central processing unit (CPU), a reduced instruction set computing (RISC) processor, a complex instruction set computing (CISC) processor, a graphics processing unit (GPU), a digital signal processor (DSP), an application-specific integrated circuit (ASIC), a radio-frequency integrated circuit (RFIC), another processor, or any suitable combination thereof) may include, for example, a processor 612. and a processor 614 that may execute the instructions 616. The term "processor" is intended to include multi-core processors that may comprise two or more independent processors (sometimes referred to as "cores") that may execute instructions 616 contemporaneously. Although FIG. 6 shows multiple processors 610, the machine 600 may include a single processor 612 with a single core, a single processor 612 with multiple cores (e.g., a multi-core processor 612), multiple processors 612, 614 with a single core, multiple processors 612, 614 with multiple cores, or any combination thereof.

The memory 630 may include a main memory 632, a static memory 634, and a storage unit 636, each accessible to the processors 610 such as via the bus 602. The main memory 632, the static memory 634, and the storage unit 636 store the instructions 616 embodying any one or more of the methodologies or functions described herein. The instructions 616 may also reside, completely or partially, within the main memory 632, within the static memory 634, within the storage unit 636, within at least one of the processors 610 (e.g., within the processor's cache memory), or any suitable combination thereof, during execution thereof by the machine 600.

The I/O components 650 may include a wide variety of components to receive input, provide output, produce output, transmit information, exchange information, capture measurements, and so on. The specific I/O components 650 that are included in a particular machine will depend on the type of machine. For example, portable machines such as mobile phones will likely include a touch input device or other such input mechanisms, while a headless server machine will likely not include such a touch input device. It will be appreciated that the I/O components 650 may include many other components that are not shown in FIG. 6. The I/O components 650 are grouped according to functionality merely for simplifying the following discussion, and the grouping is in no way limiting. In various example embodiments, the I/O components 650 may include output components 652 and input components 654. The output components 652 may include visual components (e.g., a display such as a plasma display panel (PDP), a light-emitting diode (LED) display, a liquid crystal display (LCD), a projector, or a cathode ray tube (CRT)), acoustic components (e.g., speakers), haptic components (e.g., a vibratory motor, resistance mechanisms), other signal generators, and so forth. The input components 654 may include alphanumeric input components (e.g., a keyboard, a touch screen configured to receive alphanumeric input, a photo-optical keyboard, or other alphanumeric input components), point-based input components (e.g., a mouse, a touchpad, a trackball, a joystick, a motion sensor, or another pointing instrument), tactile input components (e.g., a physical button, a touch screen that provides location and/or force of touches or touch gestures, or other tactile input components), audio input components (e.g., a microphone), and the like.

In further example embodiments, the I/O components 650 may include biometric components 656, motion components 658, environmental components 660, or position components 662, among a wide array of other components. For example, the biometric components 656 may include components to detect expressions (e.g., hand expressions, facial expressions, vocal expressions, body gestures, or eye tracking), measure biosignals (e.g., blood pressure, heart rate, body temperature, perspiration, or brain waves), identify a person (e.g., voice identification, retinal identification, facial identification, fingerprint identification, or electroencephalogram-based identification), and the like. The motion components 658 may include acceleration sensor components (e.g., accelerometer), gravitation sensor components, rotation sensor components (e.g., gyroscope), and so forth. The environmental components 660 may include, for example, illumination sensor components (e.g., photometer), temperature sensor components (e.g., one or more thermometers that detect ambient temperature), humidity sensor components, pressure sensor components (e.g., barometer), acoustic sensor components (e.g., one or more microphones that detect background noise), proximity sensor components (e.g., infrared sensors that detect nearby objects), gas sensors (e.g., gas detection sensors to detect concentrations of hazardous gases for safety or to measure pollutants in the atmosphere), or other components that may provide indications, measurements, or signals corresponding to a surrounding physical environment. The position components 662 may include location sensor components (e.g., a Global Positioning System (GPS) receiver component), altitude sensor components (e.g., altimeters or barometers that detect air pressure from which altitude may be derived), orientation sensor components (e.g., magnetometers), and the like.

Communication may be implemented using a wide variety of technologies. The I/O components 650 may include communication components 664 operable to couple the machine 600 to a network 680 or devices 670 via a coupling 682 and a coupling 672, respectively. For example, the communication components 664 may include a network interface component or another suitable device to interface with the network 680. In further examples, the communication components 664 may include wired communication components, wireless communication components, cellular communication components, near field communication (NFC) components, Bluetooth® components (e.g., Bluetooth® Low Energy), Wi-Fi® components, and other communication components to provide communication via other modalities. The devices 670 may be another machine or any of a wide variety of peripheral devices (e.g., coupled via a USB).

Moreover, the communication components 664 may detect identifiers or include components operable to detect identifiers. For example, the communication components 664 may include radio-frequency identification (RFID) tag reader components, NFC smart tag detection components, optical reader components (e.g., an optical sensor to detect one-dimensional bar codes such as Universal Product Code (UPC) bar code, multi-dimensional bar codes such as QR code, Aztec code, Data Matrix, Dataglyph, MaxiCode, PDF417, Ultra Code, UCC RSS-2D bar code, and other optical codes), or acoustic detection components (e.g., microphones to identify tagged audio signals). In addition, a variety of information may be derived via the communication components 664, such as location via Internet Protocol (IP) geolocation, location via Wi-Fi® signal triangulation, location via detecting an NFC beacon signal that may indicate a particular location, and so forth.

The various memories (e.g., 630, 632, 634, and/or memory of the processor(s) 610) and/or the storage unit 636 may store one or more sets of instructions 616 and data structures (e.g., software) embodying or utilized by any one or more of the methodologies or functions described herein. These instructions (e.g., the instructions 616), when executed by the processor(s) 610, cause various operations to implement the disclosed embodiments.

As used herein, the terms "machine-storage medium," "device-storage medium," and "computer-storage medium" mean the same thing and may be used interchangeably. The terms refer to a single or multiple storage devices and/or media (e.g., a centralized or distributed database, and/or associated caches and servers) that store executable instructions and/or data. The terms shall accordingly be taken to include, but not be limited to, solid-state memories, and optical and magnetic media, including memory internal or external to processors. Specific examples of machine-storage media, computer-storage media, and/or device-storage media include non-volatile memory, including by way of example semiconductor memory devices, e.g., erasable programmable read-only memory (EPROM), electrically erasable programmable read-only memory (EEPROM), field-programmable gate array (FPGA), and flash memory devices; magnetic disks such as internal hard disks and removable disks; magneto-optical disks; and CD-ROM and DVD-ROM disks. The terms "machine-storage media," "computer-storage media," and "device-storage media" specifically exclude carrier waves, modulated data signals, and other such media, at least some of which are covered under the term "signal medium" discussed below.

In various example embodiments, one or more portions of the network 680 may be an ad hoc network, an intranet, an extranet, a virtual private network (VPN), a local-area network (LAN), a wireless LAN (WLAN), a wide-area network (WAN), a wireless WAN (WWAN), a metropolitan-area network (MAN), the Internet, a portion of the Internet, a portion of the public switched telephone network (PSTN), a plain old telephone service (POTS) network, a cellular telephone network, a wireless network, a Wi-Fi® network, another type of network, or a combination of two or more such networks. For example, the network 680 or a portion of the network 680 may include a wireless or cellular network, and the coupling 682 may be a Code Division Multiple Access (CDMA) connection, a Global System for Mobile communications (GSM) connection, or another type of cellular or wireless coupling. In this example, the coupling 682 may implement any of a variety of types of data transfer technology, such as Single Carrier Radio Transmission Technology (1xRTT), Evolution-Data Optimized (EVDO) technology, General Packet Radio Service (GPRS) technology, Enhanced Data rates for GSM Evolution (EDGE) technology, third Generation Partnership Project (3GPP) including 3G, fourth generation wireless (4G) networks, Universal Mobile Telecommunications System (UNITS), High-Speed Packet Access (HSPA), Worldwide Interoperability for Microwave Access (WiMAX), Long-Term Evolution (LTE) standard, others defined by various standard-setting organizations, other long-range protocols, or other data transfer technology.

The instructions 616 may be transmitted or received over the network 680 using a transmission medium via a network interface device (e.g., a network interface component included in the communication components 664) and utilizing any one of a number of well-known transfer protocols (e.g., Hypertext Transfer Protocol (HTTP)). Similarly, the instructions 616 may be transmitted or received using a transmission medium via the coupling 672 (e.g., a peer-to-peer coupling) to the devices 670. The terms "transmission medium" and "signal medium" mean the same thing and may be used interchangeably in this disclosure. The terms "transmission medium" and "signal medium" shall be taken to include any intangible medium that is capable of storing, encoding, or carrying the instructions 616 for execution by the machine 600, and include digital or analog communications signals or other intangible media to facilitate communication of such software. Hence, the terms "transmission medium" and "signal medium" shall be taken to include any form of modulated data signal, carrier wave, and so forth. The term "modulated data signal" means a signal that has one or more of its characteristics set or changed in such a manner as to encode information in the signal.

The terms "machine-readable medium," "computer-readable medium," and "device-readable medium" mean the same thing and may be used interchangeably in this disclosure. The terms are defined to include both machine-storage media and transmission media. Thus, the terms include both storage devices/media and carrier waves/modulated data signals.

What is claimed is:

1. A system comprising:
    at least one hardware processor;
    a non-volatile memory; and
    a computer-readable medium storing instructions that, when executed by the at least one hardware processor, cause the at least one hardware processor to perform operations comprising:
    obtaining information obtained via a graphical user interface, the information relating to information about interactions by users with a plurality of items rendered in the graphical user interface, the information including a timestamp of a time and date at which a corresponding interaction occurred;
    upon detecting a condition that triggers a ranking of items rendered in the graphical user interface, for each item for which the condition applies:
    calculating a ranking score for the item, without ever performing a write operation for the ranking score;
    applying a decay to the ranking score by applying a Gaussian distribution to the item, the Gaussian distribution plotting the item as a distribution having interactions on a first axis and time on a second axis, using the timestamp of the item as an origin and a predetermined value as an offset to the Gaussian distribution, the offset causing a shift in the distribution on the second axis, the predetermined value being based on network traffic, to produce a decayed ranking score; and
    ranking the items for which the condition applies based on their respective decayed ranking scores;
    rendering at least a subset of items for which the condition occurs in the graphical user interface in an order matching the ranking.

2. The system of claim 1, where the condition that triggers a ranking of items is a search query matching the items.

3. The system of claim 1, wherein the condition that triggers a ranking of items is a browse request to a category that matches the items.

4. The system of claim 1, wherein the calculating a ranking score comprises:
    normalizing first information about the item;
    normalizing second information about the item; and
    calculating the ranking score by multiplying the normalized first information about the item to a first information factor, producing a first product and adding the first product to a second product calculated by multiplying the normalized second information about the item to a second information factor.

5. The system of claim 4, wherein the first information factor and the second information factor add up together to 1.

6. The system of claim 1, wherein the non-volatile memory is phase-change memory.

7. The system of claim 1, wherein the non-volatile memory is spin-transfer torque random access memory.

8. A method comprising:
    obtaining information obtained via a graphical user interface, the information relating to information about interactions by users with a plurality of items rendered in the graphical user interface, the information including a timestamp of a time and date at which a corresponding interaction occurred;
    upon detecting a condition that triggers a ranking of items rendered in the graphical user interface, for each item for which the condition applies:
    calculating a ranking score for the item, without ever performing a write operation for the ranking score;
    applying a decay to the ranking score by applying a Gaussian distribution to the item, the Gaussian distribution plotting the item as a distribution having interactions on a first axis and time on a second axis, using the timestamp of the item as an origin and a predetermined value as an offset to the Gaussian distribution, the offset causing a shift in the distribution on the second axis, the predetermined value being based on network traffic, to produce a decayed ranking score; and
    ranking the items for which the condition applies based on their respective decayed ranking scores;
    rendering at least a subset of items for which the condition occurs in the graphical user interface in an order matching the ranking.

9. The method of claim 8, where the condition that triggers a ranking of items is a search query matching the items.

10. The method of claim 8, wherein the condition that triggers a ranking of items is a browse request to a category that matches the items.

11. The method of claim 8, wherein the calculating a ranking score comprises:
    normalizing first information about the item;
    normalizing second information about the item; and
    calculating the ranking score by multiplying the normalized first information about the item to a first information factor, producing a first product and adding the first product to a second product calculated by multiplying the normalized second information about the item to a second information factor.

12. The method of claim 11, wherein the first information factor and the second information factor add up together to 1.

13. The method of claim 8, wherein the method is performed on data in phase-change memory.

14. The method of claim 8, wherein the method is performed on data in spin-transfer torque random access memory.

15. A non-transitory machine-readable medium storing instructions which, when executed by one or more processors, cause the one or more processors to perform operations comprising:
- obtaining information obtained via a graphical user interface, the information relating to information about interactions by users with a plurality of items rendered in the graphical user interface, the information including a timestamp of a time and date at which a corresponding interaction occurred;
- upon detecting a condition that triggers a ranking of items rendered in the graphical user interface, for each item for which the condition applies:
- calculating a ranking score for the item, without ever performing a write operation for the ranking score;
- applying a decay to the ranking score by applying a Gaussian distribution to the item, the Gaussian distribution plotting the item as a distribution having interactions on a first axis and time on a second axis, using the timestamp of the item as an origin and a predetermined value as an offset to the Gaussian distribution, the offset causing a shift in the distribution on the second axis, the predetermined value being based on network traffic, to produce a decayed ranking score; and
- ranking the items for which the condition applies based on their respective decayed ranking scores;
- rendering at least a subset of items for which the condition occurs in the graphical user interface in an order matching the ranking.

16. The non-transitory machine-readable medium storing instructions of claim 15, where the condition that triggers a ranking of items is a search query matching the items.

17. The non-transitory machine-readable medium storing instructions of claim 15, wherein the condition that triggers a ranking of items is a browse request to a category that matches the items.

18. The non-transitory machine-readable medium storing instructions of claim 15, wherein the calculating a ranking score comprises:
- normalizing first information about the item;
- normalizing second information about the item; and
- calculating the ranking score by multiplying the normalized first information about the item to a first information factor, producing a first product and adding the first product to a second product calculated by multiplying the normalized second information about the item to a second information factor.

19. The non-transitory machine-readable medium storing instructions of claim 18, wherein the first information factor and the second information factor add up together to 1.

20. The non-transitory machine-readable medium storing instructions of claim 15, wherein the operations are performed on data in phase-change memory.

* * * * *